(12) United States Patent
DeBrosse

(10) Patent No.: US 6,282,113 B1
(45) Date of Patent: Aug. 28, 2001

(54) FOUR F-SQUARED GAPLESS DUAL LAYER BITLINE DRAM ARRAY ARCHITECTURE

(75) Inventor: John K. DeBrosse, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/408,349

(22) Filed: Sep. 29, 1999

(51) Int. Cl.$^7$ .................................................. G11C 5/06
(52) U.S. Cl. ................... 365/63; 365/51; 365/69; 257/776; 257/907
(58) Field of Search .................... 365/51, 63, 72, 365/149, 69; 257/776, 907

(56) References Cited

U.S. PATENT DOCUMENTS

| | | | |
|---|---|---|---|
| 4,402,063 | * 8/1983 | Wittwer | 365/154 |
| 5,107,459 | * 4/1992 | Chu et al. | 365/63 |
| 5,194,752 | * 3/1993 | Kumagai et al. | 257/390 |
| 5,315,542 | * 5/1994 | Melzner | 365/72 |
| 5,416,734 | * 5/1995 | Hidaka et al. | 365/63 |
| 5,821,592 | 11/1998 | Hoenigschmid et al. | 257/390 |
| 5,864,496 | * 1/1999 | Mueller et al. | 365/69 |
| 6,108,230 | * 8/2000 | Anh et al. | 365/63 |

OTHER PUBLICATIONS

Nakano, H., et al., "A dual layer bitline DRAM array with Vcc/Vss/Vss hybrid precharge for multi–gigabit DRAMs," 1996 Symp. on VLSI Circuits Digest of Technical Papers, pp. 190–191.

\* cited by examiner

Primary Examiner—Son Mai
(74) Attorney, Agent, or Firm—Connolly Bove Lodge & Hutz

(57) ABSTRACT

A semiconductor device having a compact folded bitline architecture. Bitlines for a memory cell array arranged into bitline pairs constituting, when in use, a selected bitline and its complement. The selected bitline and its complement are adjacent in upper and lower levels, and exchange levels at selected breakpoints in the lower level bitline. The breakpoints are determined so as to establish a diagonally-oriented pattern of "twist regions" across the array. Adjacent bitline pairs exchange levels in alternating twist regions. The upper bitlines are positioned at a predetermined angle, relative to the lower bitlines, in selected intervals between the twist regions. The predetermined angle introduces an offset between the upper bitlines and their associated complement lower bitlines as the upper bitlines enter twist regions to exchange levels. The diagonal orientation of the twist regions, alternating pattern of breakpoints, and offsets eliminate gaps in the memory array which would otherwise be introduced in the twist regions, providing for enhanced cell density and a minimum cell area of approximately $4F^2$.

22 Claims, 8 Drawing Sheets

FOUR F-SQUARED GAPLESS DUAL LAYER BITLINE DRAM ARRAY ARCHITECTURE

BACKGROUND OF THE INVENTION

The present invention relates to the field of semiconductor memory devices, and in particular to a DRAM array having a compact folded bitline architecture.

It is a continuing goal in computer memory design, such as in the design of Dynamic Random Access Memory (DRAM) arrays, to achieve increased storage capacity in smaller devices. Typically, this entails finding ways of packing memory cells as densely as possible into as small an area as possible.

In DRAM arrays, individual memory cells are accessed by bitlines and wordlines. Generally speaking, one limitation on the degree to which the size of a memory cell in an array can be reduced is determined by the "pitch" of the bitlines and wordlines required to address a single cell. A pitch is equivalent to the width of a bitline or wordline, plus the distance to neighboring bitlines or wordlines in the array.

FIG. 9A shows a memory cell 900 in a DRAM array. The cell is accessed, for reading from or writing to, by a bitline 901 and a wordline 902. FIG. 9A illustrates, for example, that for a bitline pitch of 3F (where "F" is the minimum lithographic feature size and is technology-dependent) and a wordline pitch of 2F, the minimum size for a memory cell in the array is approximately $6F^2$. Similarly, as shown in FIG. 9B, for a bitline pitch of 2F and a wordline pitch of 2F, a memory cell 903 having an area of only $4F^2$ can be accessed.

Folded bitline architecture is known in DRAM arrays. In folded bitline architecture, the voltage on a selected bitline is compared to a voltage on a complement bitline. The complement bitline provides a reference signal for comparison to the signal on the selected bitline such that the actual stored bit in an array memory cell is distinguished as the difference between signals on the selected bitline and the complement bitline.

Conventionally, in a folded bitline DRAM, the bitlines of the memory array are laid out so that each bitline and its associated complement are parallel to each other on the same level. FIG. 9C shows an example of a memory cell accessed by a folded bitline architecture. In FIG. 9C, bitline 901 and its complement $\overline{901}$, and wordline 902 are used to access memory cell 904. The arrangement requires a minimum of about $8F^2$ semiconductor area per cell to implement.

Open bitline architectures are known which have a theoretical minimum of $4F^2$ array area per cell, but folded bitline architecture is preferable in that it provides better noise immunity.

Techniques have been disclosed for providing the advantages of folded bitline architecture while reducing the minimum cell area required. Nakano et. al (1996 Symposium on VLSI Circuits Digest of Technical Papers, p. 190–191) describes a bitline architecture in which a bitline and its complement are vertically parallel on subsequent levels rather than being adjacent and parallel on the same level. The lower bitline is connected to the underlying cells by contacts. The bitline and its complement exchange levels in "twist regions" at one or more locations in order to match capacitance. The architecture supports a minimum cell size of $5-6F^2$.

However, the twist region layout of Nakano et al. does not allow the array to continue uninterrupted through the twist region. Instead, a gap, i.e., an absence of memory cells, in the layout pattern exists which reduces the array density. The gap is necessitated by a crowding of contacts within the twist region, and by a third metal level which is used for the exchange of bitline levels. As this level is normally fully utilized within the array as the wordline, a gap in the array is required to allow its use within the twist region.

U.S. Pat. No. 5,821,592 to Hoenigschmid et al. describes a bitline architecture which eliminates the afore-mentioned gaps, to achieve an improvement in array density. The architecture supports a minimum cell size of approximately $6F^2$.

SUMMARY OF THE INVENTION

A semiconductor device according to the present invention achieves a folded bitline architecture for a DRAM array with minimum cell area requirements comparable to those of open bitline architectures, while eliminating gaps in the array. According to the present invention, a bitline and its complement are stacked adjacently in lower and upper levels over a memory cell array, rather than being adjacent and parallel on the same level. The bitline and its complement alternate between the upper and lower levels.

In such a bitline pair, the lower bitline is connected to the memory cells and is interrupted by breakpoints with a predetermined spacing. In selected intervals between the breakpoints, the upper bitline is positioned at a predetermined angle relative to the lower bitline, and connects with the lower bitline at the breakpoints to effect the exchange of levels.

In a plurality of such bitline pairs in the architecture, a displacement between breakpoints in adjacent lower bitlines is determined so as to effect a staggering of breakpoints whereby a plurality of diagonal "twist regions" are defined, each twist region including breakpoints in alternating lower bitlines.

The diagonal structure of the layout associated with the staggering of breakpoints, and the angling of the upper bitlines with respect to the lower bitlines allow the underlying cell array to continue without interruption, while maintaining a lower bitline pitch of approximately 2F. Thus, the twist region gap of the prior art is avoided, while enabling support for a minimum cell area of approximately $4F^2$.

DETAILED DESCRIPTION OF THE INVENTION

Figure 1:
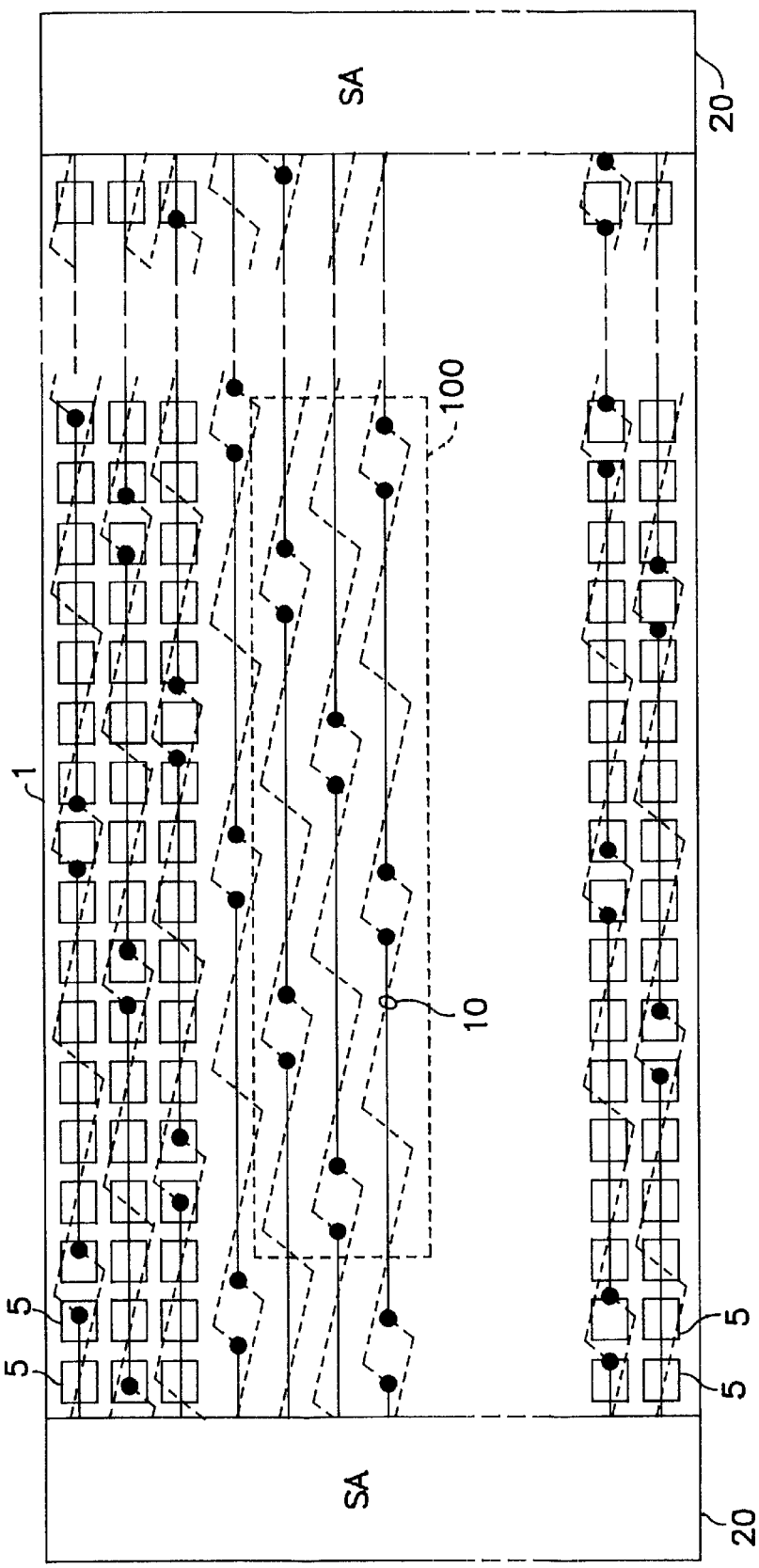
FIG. 1 shows an array of memory cells overlaid by a bitline architecture according to the present invention.

A preferred embodiment of a semiconductor device according to the present invention is shown in FIG. 1. The device comprises a DRAM array 1 (broken lines in border regions indicate a continuation of the array) of memory cells 5 and a plurality of bitline pairs 10 and wordlines (not shown). The bitline pairs are connected between sense amplifiers 20. In a known manner, to read from/write to selected memory cells, a memory cell address is input to row/column decoders (not shown) which generate signals to activate a selected wordline and bitline corresponding to the address. The selected bitline and its complement input or output a small differential voltage value representing a logic "0" or "1" in response to the signals. In a read operation, the sense amplifiers amplify the voltage value to a full logic level for output to the required application.

Figure 2:
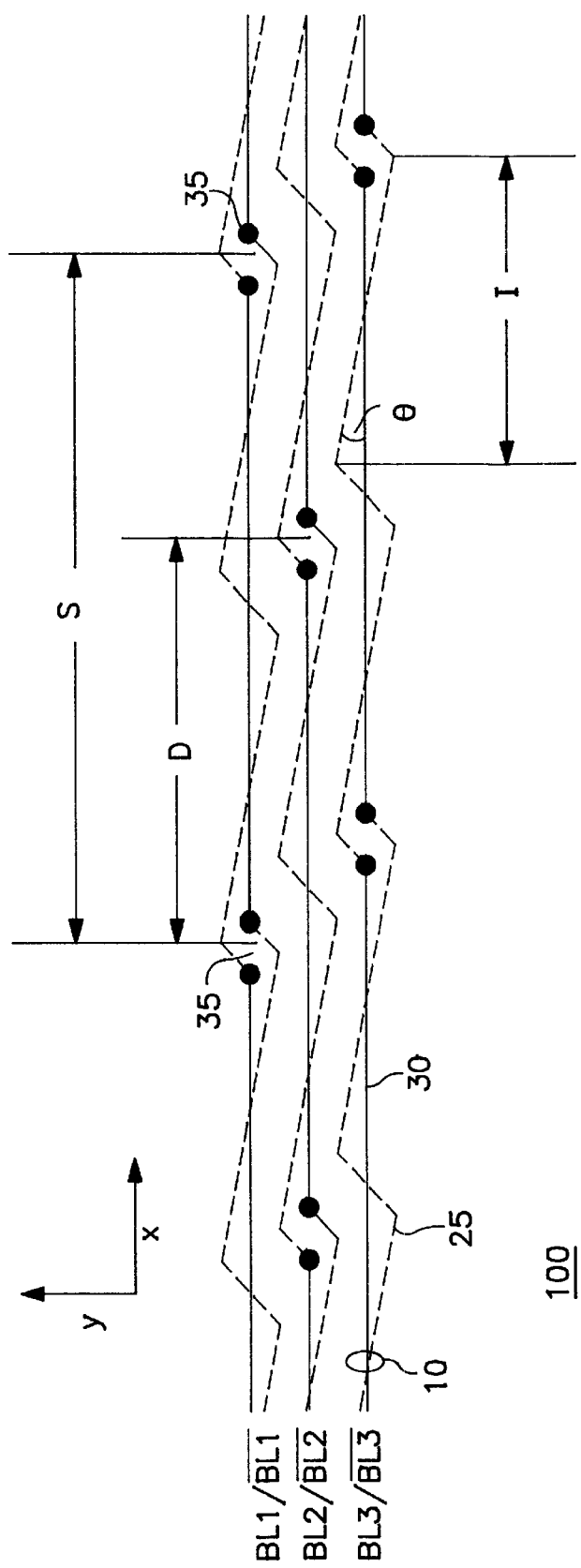
FIG. 2 shows an enlarged view of a section of the array of FIG. 1, omitting the underlying memory cells.

In FIG. 1, for greater clarity, a section 100 of the array is shown without the underlying memory cells being depicted. FIG. 2 shows an enlarged view of the section 100.

Referring now to FIG. 2, examples of bitline pairs BL1/$\overline{BL1}$, BL2/$\overline{BL2}$ and BL3/$\overline{BL3}$ ($\overline{BL\#}$=the complement signal of BL#) are shown. A bitline pair comprises a lower bitline 30 and an upper bitline 25, which, when in use, propagate a signal and its complement to communicate a differential voltage value. The lower bitline is connected to the underlying memory cells in order to read from/write to the memory cells, and is interrupted by breakpoints 35, i.e., points at which the lower bitline is discontinuous, separated by a predetermined space S.

At the breakpoints 35, the upper and lower bitlines exchange levels. That is, an upper bitline 25 approaches a breakpoint 35 from one side of the breakpoint, traverses the breakpoint and is connected to a lower bitline 30 on the opposite side. Thus, a signal and its complement are alternately propagated on upper and lower bitlines across the extent of the array. This provides for capacitance matching and differential noise reduction.

The upper bitline 25 is positioned over the lower bitline 30 at a predetermined angle θ relative to the lower bitline in selected intervals I between the breakpoints 35. As will become evident, this angle introduces an offset between the upper bitline and the lower bitline as the upper bitline approaches a breakpoint in the lower bitline. The offset allows the upper level bitlines to avoid the upper-to-lower bitline contacts of its complement bitline when exchanging levels.

Figure 3:
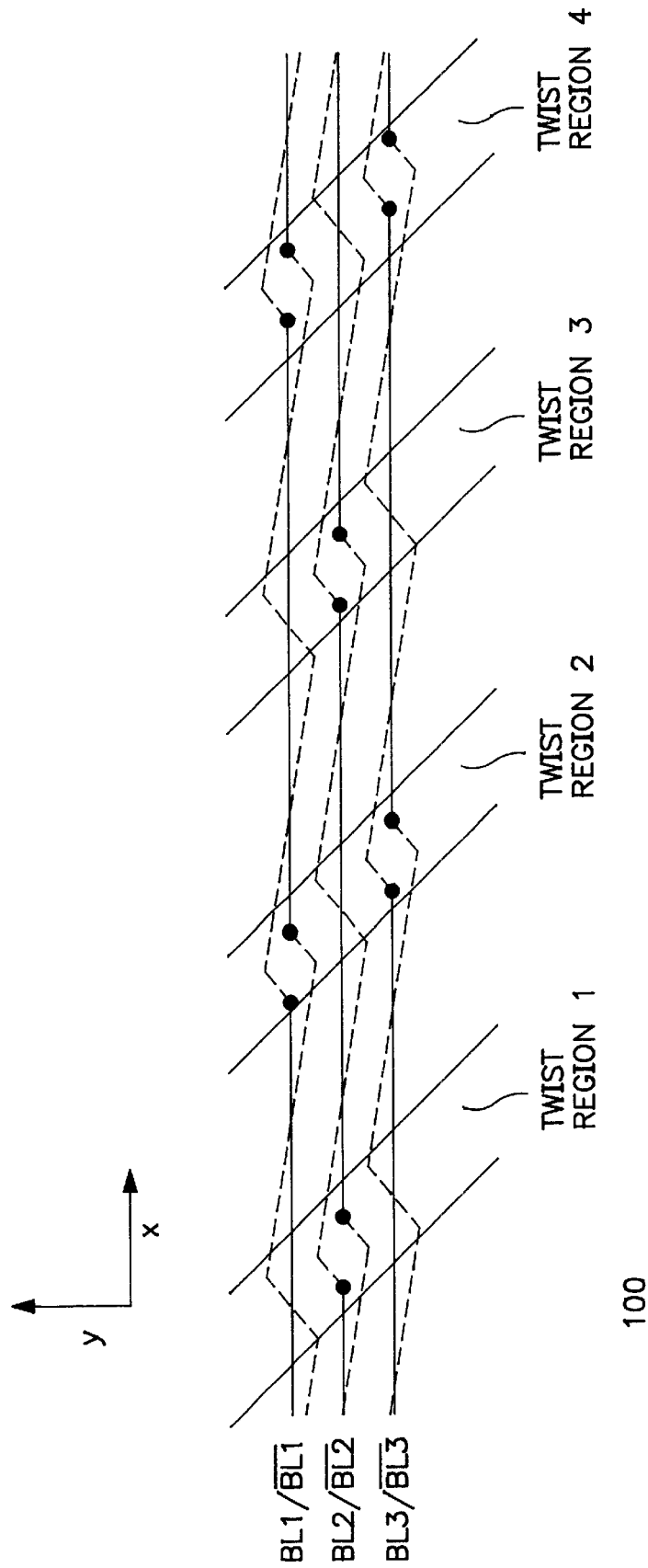
FIG. 3 shows the same section as FIG. 2, with the addition of designating "twist regions" in the section.

A displacement D in a direction X orthogonal to a direction Y is determined between breakpoints in adjacent lower bitlines so as to establish a regular, staggered pattern of breakpoints. Referring now to FIG. 3, from a perspective which includes a plurality of bitline pairs, the pattern establishes "twist regions". A twist region is a diagonally-oriented area of the array which includes breakpoints in alternating lower bitlines.

As shown in FIG. 3, a bitline pair exchanges levels in alternating twist regions. For example, bitline pair BL1\$\overline{BL1}$ exchanges levels in twist regions 2 and 4. Consequently, adjacent bitline pairs exchange levels in separate but adjacent twist regions. For example, bitline pair BL2\$\overline{BL2}$ adjacent to bitline pair BL1\$\overline{BL1}$ exchanges levels in twist regions 1 and 3. This pattern is repeated across the array (see FIG. 1).

Figure 4:
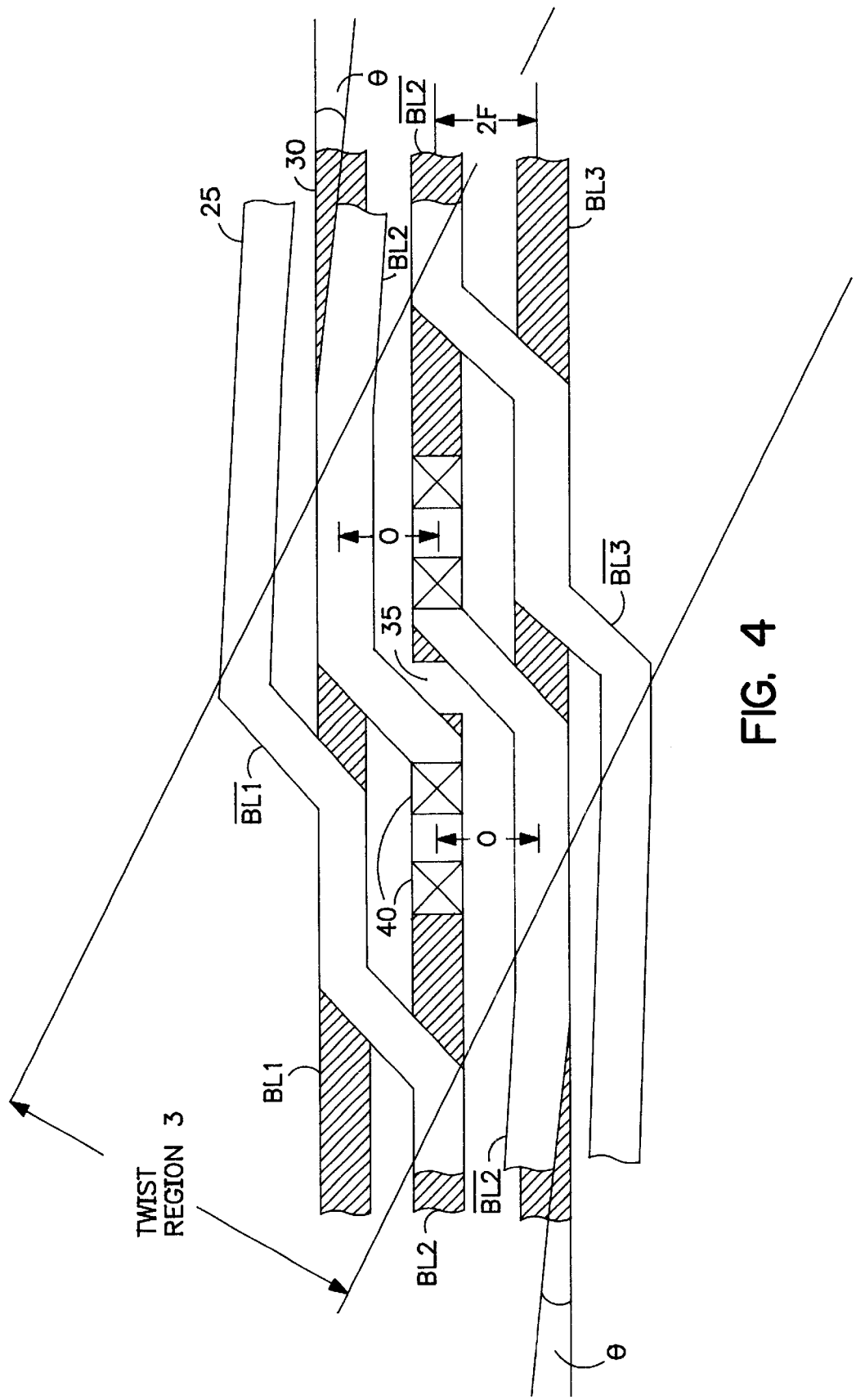
FIG. 4 shows an enlarged view of twist region 3 of FIG. 3.

FIG. 4 shows an enlarged view of twist region 3 from FIG. 2, including bitline pairs BL1/$\overline{BL1}$, BL2/$\overline{BL2}$ and BL3/$\overline{BL3}$. The view is substantially enlarged so that the bitline pairs appear as two-dimensional bars or bands; lower bitlines are indicated by cross-hatching. Contacts 40 between upper bitlines 25 and lower bitlines 40 are shown as "X"-ed boxes.

In FIG. 4, signal BL2 is propagated on a lower bitline 30 as the lower bitline approaches breakpoint 35 from the left side of FIG. 4. The complement signal $\overline{BL2}$ is propagated on an upper bitline 25 as the upper bitline approaches breakpoint 35 from the left. At the breakpoint, BL2 and $\overline{BL2}$ exchange levels, so that BL2 is propagated on an upper bitline and $\overline{BL2}$ is propagated on a lower bitline to the right of the breakpoint.

In FIG. 4, it can be seen that predetermined angle θ, relative to the lower bitline carrying BL2, in the position of the upper bitline carrying $\overline{BL2}$ on the left side of breakpoint 35, over the length of the interval I introduces an offset O between $\overline{BL2}$ and its complement lower bitline BL2 within the twist region 3. In a preferred embodiment, the offset is approximately 2F. Similarly, the upper bitline carrying BL2 on the right side of breakpoint 35 has an offset O from its complement lower bitline carrying $\overline{BL2}$.

As mentioned above, the offset O allows a bitline, as it enters a twist region to exchange levels, to avoid the upper-to-lower bitline contacts of its complement bitline. In conjunction with the diagonal orientation of the twist regions and alternation of breakpoints across twist regions, the offsets allow the continuity of the array to be preserved through twist regions, providing for uniform memory cell density throughout the array.

As noted above and shown in FIG. 4, the foregoing architecture provides for a minimum cell area of approximately $4F^2$, since the upper bitline pattern across the array allows for a lower bitline pitch of approximately 2F. In the event that the cell technology does not support such a small cell area, the architecture may still be used, and the resulting extra area may be used to relax constraints on the twist contact and upper bitline layouts.

In a preferred embodiment, each bitline pair passes through four or more twist regions.

Figure 5:
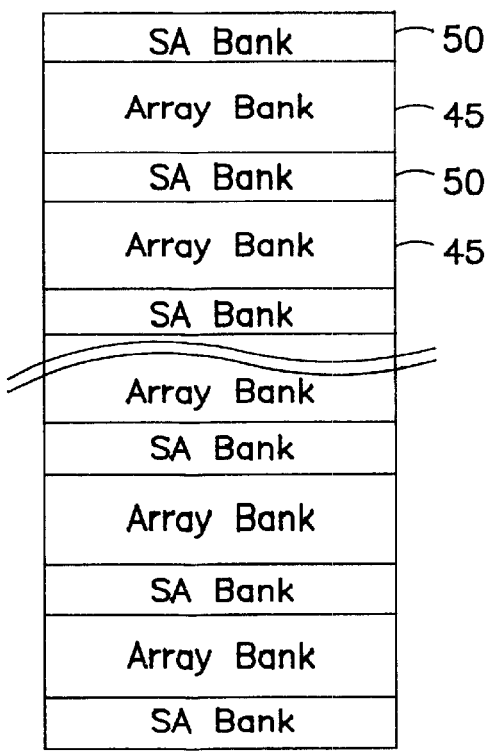
FIG. 5 shows an arrangement of sense amplifier banks and memory array banks for an embodiment of the invention.

The invention may be fabricated by standard lithographic processes. In a preferred embodiment, DRAM arrays 1 having the above-described bitline architecture are included in a 1 Gbit computer memory chip including 16 64 Mbit units. FIG. 5 shows an arrangement of memory array banks 45 comprising a plurality of DRAM arrays 1 and sense amplifiers (SA) banks 50 comprising a plurality of sense amplifiers 20. Each 64 Mbit unit includes 16 4 Mbit array banks 45 and 17 SA banks 50.

Figure 6:
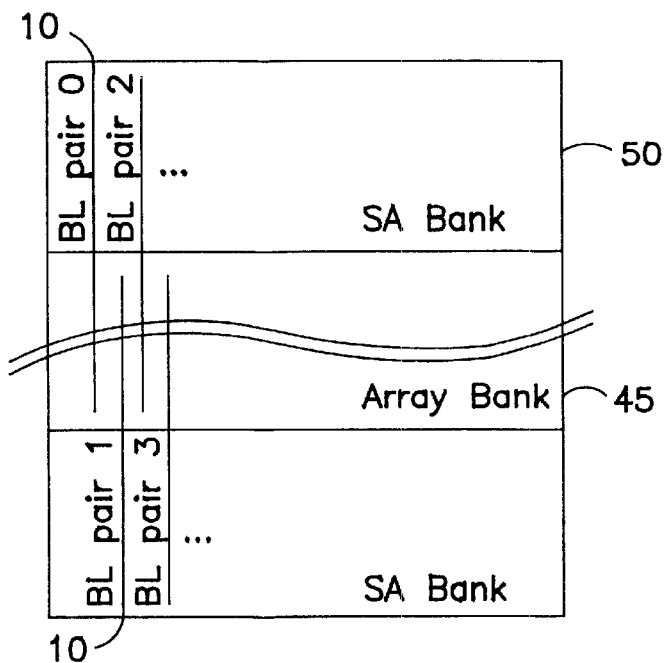
FIG. 6 shows bitline pair connections between sense amplifier banks of the embodiment of FIG. 5.

As shown in FIG. 6, each 4 Mbit array bank 45 comprises 4K bitline (BL) pairs 10 by 1K wordlines (WL) (not shown). The connections between the array banks 45 and SA banks 50 are made in an interleaved manner, in which every other array BL pair 10 is connected to the upper or lower SA bank 50. Hence, when a WL is selected in a particular array bank 45, the SA banks above and below that array bank are activated.

Figure 7:
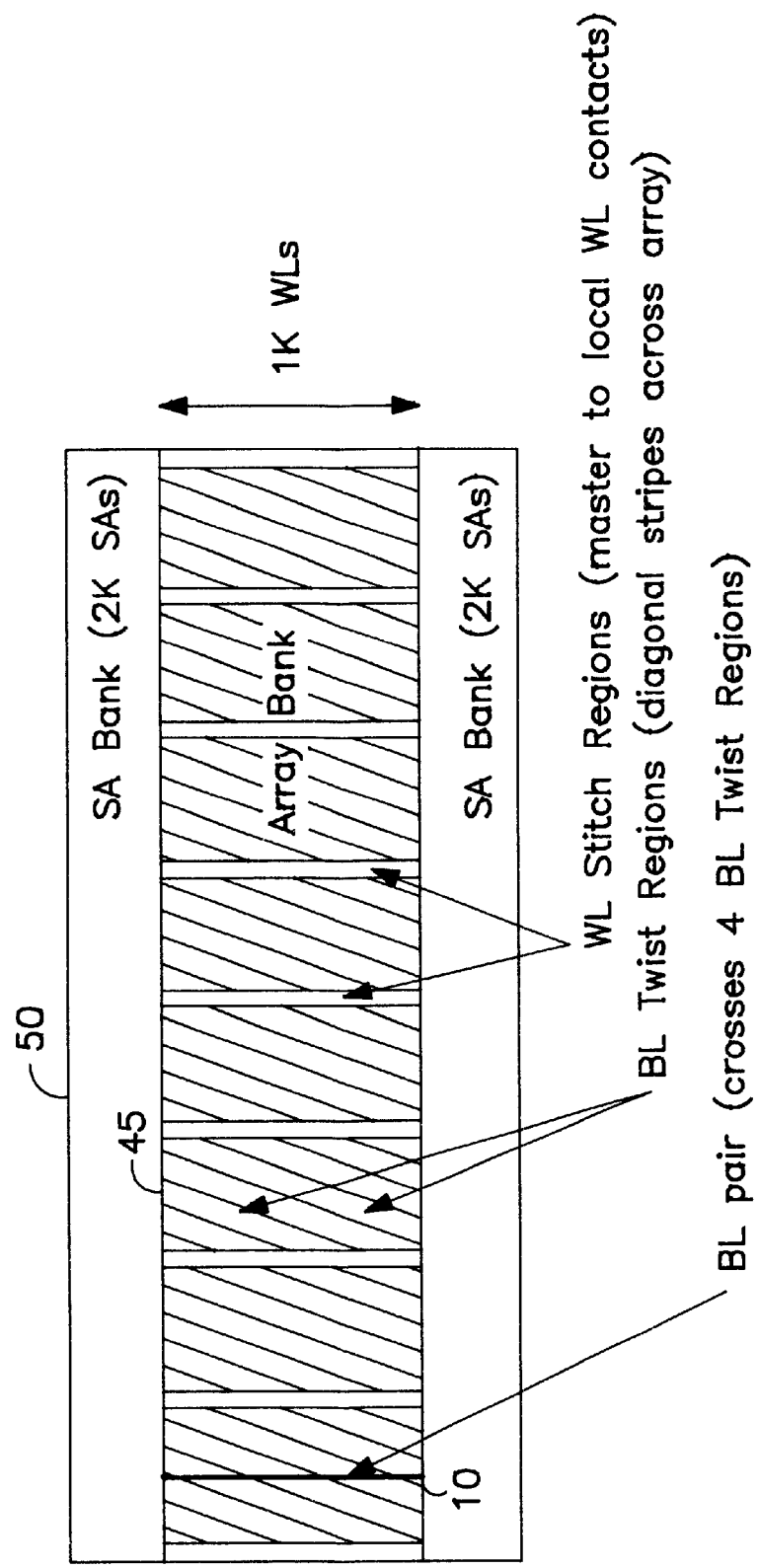
FIG. 7 shows an arrangement of memory array banks for the above embodiment.

As shown in FIG. 7, the array bank 45 is broken into 8 regions by the WL stitch regions, in which the third metal (M2) master WLs make contact to the gate conductor local WLs. The twist regions, in which the BL pairs 10 exchange levels, are arranged so that each BL pair passes through 4 twist regions.

Figure 8:
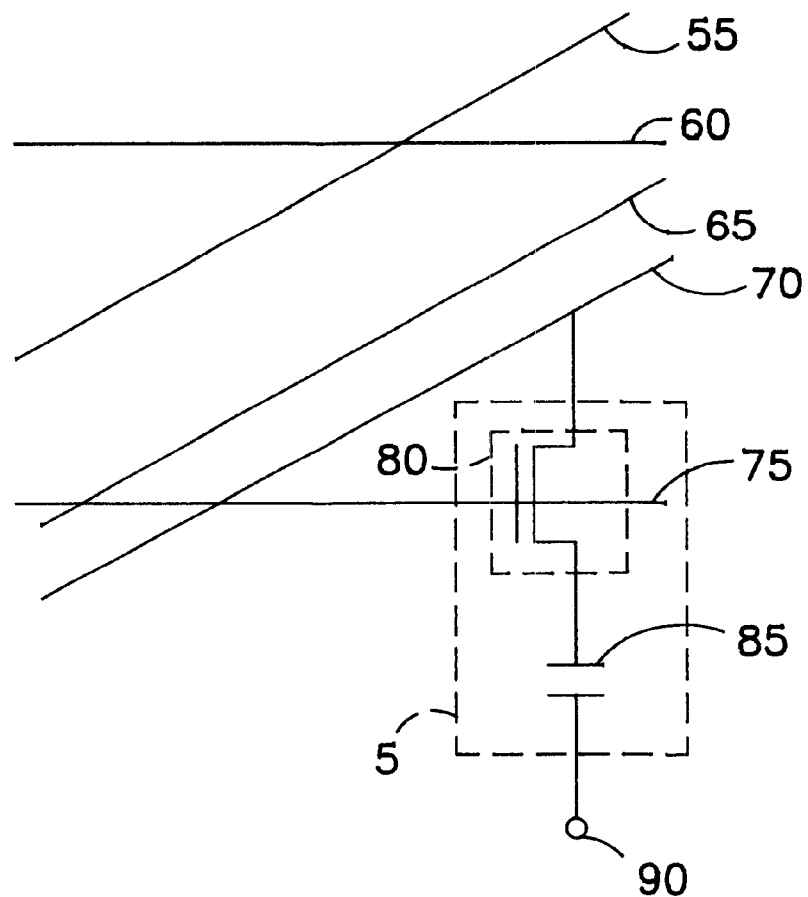
FIG. 8 shows a schematic representation of a section of a DRAM array including elements associated with accessing a memory cell.
Figure 9A:
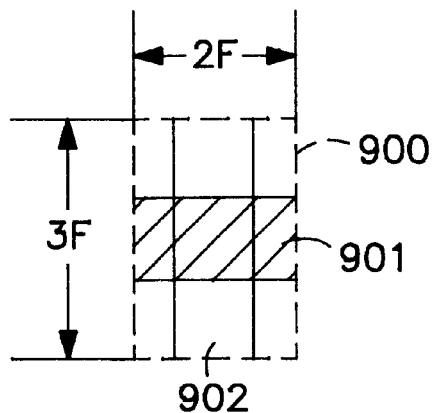
FIGS. 9A and 9B show examples of minimum cell area requirements associated with varying bitline and wordline pitches.
Figure 9B:
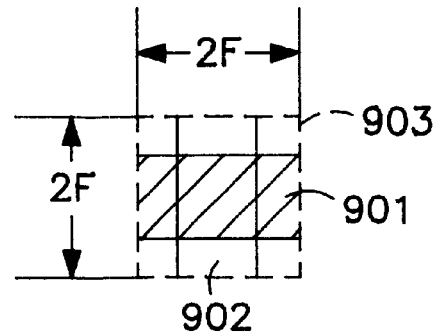
Figure 9C:
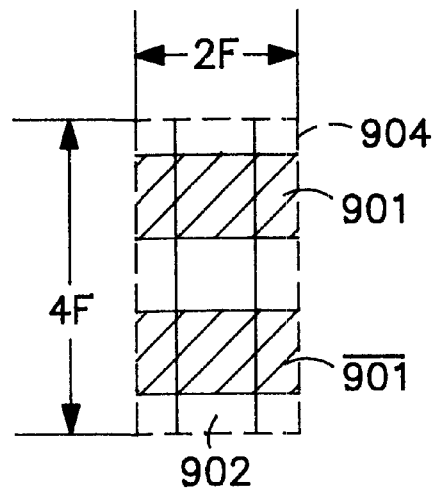
FIG. 9C shows a memory cell accessed by a prior art folded bitline architecture.

FIG. 8 shows a schematic representation of a section of a DRAM array 1 including elements associated with accessing a memory cell 5. The technology employed, according to a preferred embodiment, includes a trench capacitor 85 for storing a charge corresponding to a logic "0" or "1", connected to a plate 90, an NFET transfer device 80 for read/write control, a silicided gate conductor for the wordline 75, a first metal level (M0) 70 for the lower bitline connected to the memory cell 5, a second metal level (M1) 65 for the upper bitline, a third metal level (M2) 60 for the master wordlines, and a fourth metal level (M3) 55 for the column select and data I/O lines over the array.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A semiconductor device comprising:

an array of memory cells; and a bitline pair extending across said array and comprising a lower bitline and an upper bitline, wherein:

said lower bitline is connected to said memory cells and is interrupted by breakpoints; and in selected intervals between said breakpoints, said upper bitline is positioned over said lower bitline at a predetermined angle relative thereto, and is connected to said lower bitline at said selected breakpoints.

2. The semiconductor device of claim 1, wherein:

said bitline pair, when in use, constitutes a selected bitline and its complement, for reading or writing data from or to a selected memory cell.

3. The semiconductor device of claim 2, wherein:

at said breakpoints in said lower bitline, said selected bitline and said complement exchange levels, whereby:

for a first extent of said lower bitline preceding a breakpoint, said selected bitline is the upper bitline and said complement is the lower bitline; and for a second extent following said selected breakpoint, said selected bitline is the lower bitline and said complement is the upper bitline.

4. The semiconductor device of claim 3, further comprising:

a plurality of said bitline pairs adjacent to each other.

5. The semiconductor device of claim 4, wherein:

a displacement is determined between breakpoints in adjacent lower bitlines so as to establish a plurality of twist regions, each twist region defining a diagonally-oriented area of said array which includes selected breakpoints in alternating lower bitlines.

6. The semiconductor device of claim 5, wherein a bitline pair exchanges levels in alternating twist regions.

7. The semiconductor device of claim 5, wherein adjacent bitline pairs exchange levels in separate but adjacent twist regions.

8. The semiconductor device of claim 5, wherein:

within a twist region including a breakpoint in said lower bitline, said upper bitline is offset from said lower bitline.

9. The semiconductor device of claim 8, wherein said predetermined angle is determined so as to provide said offset.

10. The semiconductor device of claim 8, wherein said offset is approximately 2F, where F is the minimum lithographic feature size.

11. The semiconductor device of claim 5 wherein each bitline pair passes through four or more twist regions.

12. The semiconductor device of claim 5, said bitline pairs being connected between first and second sense amplifier banks in an alternating manner, wherein:

a first bitline pair is connected to said first sense amplifier bank, and a second bitline pair adjacent to said first bitline pair is connected to said second sense amplifier bank.

13. A method for increasing the density of an array of memory cells, comprising:

providing a bitline pair extending across said array and comprising a lower bitline and an upper bitline, wherein:

said lower bitline is connected to said memory cells and is interrupted by breakpoints; and in selected intervals between said breakpoints, said upper bitline is positioned over said lower bitline at a predetermined angle relative thereto, and is connected to said lower bitline at said selected breakpoints.

14. The method of claim 13, wherein:

said bitline pair, when in use, constitutes a selected bitline and its complement, for reading or writing data from or to a selected memory cell.

15. The method of claim 14, wherein:

at said breakpoints in said lower bitline, said selected bitline and said complement exchange levels, whereby:

for a first extent of said lower bitline preceding a breakpoint, said selected bitline is the upper bitline and said complement is the lower bitline; and for a second extent following said selected breakpoint, said selected bitline is the lower bitline and said complement is the upper bitline.

16. The method of claim 15, further comprising:

providing a plurality of said bitline pairs adjacent to each other.

17. The method of claim 16, wherein:

a displacement is determined between breakpoints in adjacent lower bitlines so as to establish a plurality of twist regions, each twist region defining a diagonally-oriented area of said array which includes selected breakpoints in alternating lower bitlines.

18. The method of claim 17, wherein a bitline pair exchanges levels in alternating twist regions.

19. The method of claim 17, wherein adjacent bitline pairs exchange levels in separate but adjacent twist regions.

20. The method of claim 17, wherein:

within a twist region including a breakpoint in said lower bitline, said upper bitline is offset from said lower bitline.

21. The method of claim 20, wherein said predetermined angle is determined so as to provide said offset.

22. The method of claim 20, wherein said offset is approximately 2F, where F is the minimum lithographic feature size.

* * * * *